(12) United States Patent
Nakamura

(10) Patent No.: US 9,648,793 B2
(45) Date of Patent: May 9, 2017

(54) CONDUCTIVE MEMBER AND ELECTROMAGNETIC SHIELD STRUCTURE

(71) Applicant: Kitagawa Industries Co., Ltd., Inazawa-shi, Aichi (JP)

(72) Inventor: Tatsuya Nakamura, Inuyama (JP)

(73) Assignee: Kitagawa Industries Co., Ltd., Inazawa-shi, Aichi (JP)

( * ) Notice: Subject to any disclaimer, the term of this patent is extended or adjusted under 35 U.S.C. 154(b) by 0 days.

(21) Appl. No.: 14/934,770

(22) Filed: Nov. 6, 2015

(65) Prior Publication Data

US 2016/0135335 A1    May 12, 2016

(30) Foreign Application Priority Data

Nov. 6, 2014    (JP) .................................. 2014-226508

(51) Int. Cl.
*H05K 9/00* (2006.01)
*H01R 12/57* (2011.01)
(Continued)

(52) U.S. Cl.
CPC .............. *H05K 9/0026* (2013.01); *H01R 4/02* (2013.01); *H01R 4/48* (2013.01); *H01R 12/57* (2013.01); *H01R 13/2442* (2013.01); *H05K 1/0216* (2013.01); *H05K 1/181* (2013.01); *H05K 9/0035* (2013.01); *H01R 13/245* (2013.01); *H01R 13/6594* (2013.01); *H01R 2201/26* (2013.01)

(58) Field of Classification Search
CPC .......................... H05K 9/0035; H01R 13/6594
See application file for complete search history.

(56) References Cited

U.S. PATENT DOCUMENTS 5,792,994 A * 8/1998 Akahane .............. H05K 9/0035
174/138 G
7,884,288 B2 * 2/2011 Meyer .................. H05K 9/0032
174/368
(Continued)

FOREIGN PATENT DOCUMENTS

EP    2 903 401 A1    4/2014
JP    2003-168510 A    6/2003
(Continued)

OTHER PUBLICATIONS

Extended European Search Report for Application No. 15193104.5 dated Mar. 31, 2016.

*Primary Examiner* — Hung V Ngo
(74) *Attorney, Agent, or Firm* — Jenkins, Wilson, Taylor & Hunt, P.A.

(57) ABSTRACT

A conductive member of this disclosure includes a bent metal thin plate. The metal thin plate includes a base portion having a first surface serving as a joint surface for soldering, a first spring portion connected to part of the base portion, and a second spring portion provided above a second surface of the base portion opposite to the first surface. The first spring portion inclines in a direction away from a tangent plane of the first surface such that an angle between the first spring portion and the first surface is an obtuse angle, and generates repulsion force against force toward the tangent plane. The second spring portion generates repulsion force parallel to a direction from the base portion toward the first spring portion.

7 Claims, 4 Drawing Sheets

(51) Int. Cl.
*H01R 13/24* (2006.01)
*H01R 4/02* (2006.01)
*H01R 4/48* (2006.01)
*H05K 1/02* (2006.01)
*H05K 1/18* (2006.01)
H01R 13/6594 (2011.01)

(56) References Cited

U.S. PATENT DOCUMENTS

| | | | |
|---|---|---|---|
| 8,827,723 B2* | 9/2014 | Liao | H01R 13/62 |
| | | | 439/607.55 |
| 9,338,930 B2* | 5/2016 | Jang | H05K 9/0035 |
| 2005/0023018 A1* | 2/2005 | Horng | H05K 9/0035 |
| | | | 174/384 |
| 2009/0057002 A1* | 3/2009 | Kakinoki | H05K 3/341 |
| | | | 174/350 |
| 2010/0261359 A1* | 10/2010 | Chan | H05K 3/341 |
| | | | 439/81 |
| 2015/0222035 A1 | 8/2015 | Kurita | |

FOREIGN PATENT DOCUMENTS

| | | |
|---|---|---|
| JP | 2014-072317 A | 4/2014 |
| WO | WO 2014/050888 A1 | 5/2014 |

* cited by examiner

CONDUCTIVE MEMBER AND ELECTROMAGNETIC SHIELD STRUCTURE

CROSS-REFERENCE TO RELATED APPLICATION

This application claims priority to Japanese Patent Application No. 2014-226508 filed with the Japanese Patent Office on Nov. 6, 2014, the entire content of which is hereby incorporated by reference.

TECHNICAL FIELD

The present disclosure relates to a conductive member and an electromagnetic shield structure using the conductive member.

BACKGROUND

Conductive members have been typically used for various purposes such as conduction between a ground electrode of a printed circuit board and a sheet-metal of a shield case. The conductive members of this type include a vertical contact type and a side contact type. In the conductive member of the vertical contact type, repulsion force generated against force for pressing a sheet-metal or the like toward a printed circuit board or the like is used to bring the conductive member in pressure-contact with the sheet-metal. In the conductive member of the side contact type, the conductive member comes into pressure-contact with a side surface of a sheet-metal or the like by resilient force acting laterally in a pressing direction of the sheet-metal or the like (for example, see JP-A-2014-072317).

SUMMARY

A conductive member of the present disclosure includes a bent metal thin plate. The metal thin plate includes a base portion having a first surface serving as a joint surface for soldering, a first spring portion connected to part of the base portion, and a second spring portion provided above a second surface of the base portion opposite to the first surface. The first spring portion inclines in a direction away from a tangent plane of the first surface such that an angle between the first spring portion and the first surface is an obtuse angle, and generates repulsion force against force toward the tangent plane. The second spring portion generates repulsion force parallel to a direction from the base portion toward the first spring portion.

BRIEF DESCRIPTION OF THE DRAWINGS

The present invention will now be described by way of example with reference to the accompanying drawings, in which:

FIG. 1A is a left-side view illustrating the configuration of a conductive member of an embodiment of the present disclosure;

FIG. 1B is a front view illustrating the configuration of the conductive member;

FIG. 1C is a back view illustrating the configuration of the conductive member;

FIG. 1D is a plan view illustrating the configuration of the conductive member;

FIG. 1E is a lower view illustrating the configuration of the conductive member;

FIG. 1F is an upper left perspective view illustrating the configuration of the conductive member;

DETAILED DESCRIPTION

Figure 2A:
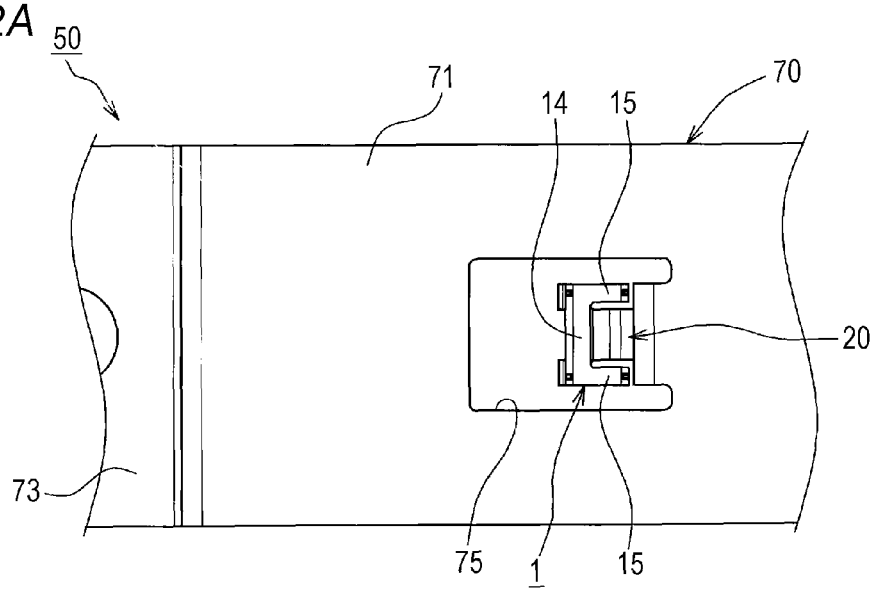
FIG. 2A is a plan view illustrating the configuration of a main portion of an electromagnetic shield structure using the conductive member.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

For conductive members used for vehicles and the like, it is required to inhibit corrosion even if the conductive members are exposed to an extremely-high or extremely-low temperature. One of the methods for inhibiting the corrosion of the conductive member is the method in which the contact pressure between the conductive member and a sheet-metal or the like is set to be high. However, if a contact pressure is set to be high for a vertical contact type conductive member, a printed circuit board on which the conductive member is mounted might deflect due to the contact pressure. On the other hand, in a side contact type conductive member, the probability of deflecting a printed circuit board is low. However, the path in which current flows tends to be longer. For this reason, an impedance might be high. Moreover, for conductive members used for vehicles and the like, it is required not to be damaged even when strong vibration is repeatedly applied.

As described above, it is required for a conductive member to, even if a contact pressure between the conductive member and a sheet-metal or the like is set to be high, inhibit deflection of a printed circuit board or the like on which the conductive member is mounted, to provide a lower impedance, and to exhibit a high durability against vibration.

A conductive member of the present disclosure includes a bent metal thin plate. The metal thin plate includes a base portion having a first surface serving as a joint surface for soldering, a first spring portion connected to part of the base portion, and a second spring portion provided above a second surface of the base portion opposite to the first surface. The first spring portion inclines in a direction away from a tangent plane of the first surface such that an angle between the first spring portion and the first surface is an obtuse angle, and generates repulsion force against force toward the tangent plane. The second spring portion generates repulsion force parallel to a direction from the base portion toward the first spring portion.

The conductive member configured as described above includes the first and second spring portions. The second spring portion generates repulsion force parallel to the direction from the base portion toward the first spring portion. In the case where a wall extends down from a sheet-metal or the like in the direction perpendicular to the tangent plane of the first surface of the base portion, such a wall can pressure-contact the second spring portion laterally (i.e., in the direction along the tangent plane). Thus, even if such contact pressure is set high, the deflection of a printed circuit board or the like is inhibited. Moreover, since the wall laterally pressure-contacts the second spring portion as described above, the second spring portion is less susceptible to vibration. Thus, the second spring portion has favorable durability. Note that the repulsion force generated by the second spring portion does not necessarily have only a component parallel to the direction from the base portion toward the first spring portion. Such repulsion force may have a component toward other direction.

The first spring portion is directly connected to part of the base portion. When receiving, from the wall, force acting toward the tangent plane, the first spring portion generates repulsion force against such force and comes into pressure-contact with the wall. Thus, a power distribution path from the wall to the tangent plane of the base portion is shortened. Consequently, a lower impedance can be realized. Moreover, the first spring portion is connected to the base portion, and is inclined in the direction away from the tangent plane. Further, the angle between the first spring portion and the first surface of the base portion is an obtuse angle. Thus, even when the first spring portion repeatedly receives vibration, damage of the connection portion between the first spring portion and the base portion is inhibited. Consequently, the first spring portion has favorable durability.

In addition, the repulsion force applied to the wall by the first spring portion has such a component that brings the wall in pressure-contact with the second spring portion. Thus, the contact pressure between the wall and the second spring portion further increases. Further, the moment of force applied from the wall to the entirety of the conductive member through the first spring portion points in the direction opposite to the moment of force applied from the wall to the entirety of the conductive member through the second spring portion. Thus, the deflection of the printed circuit board or the like is more favorably inhibited.

Note that the conductive member configured as described above may further include a pair of frame portions. The pair of frame portions may be provided on the second surface on both sides of the second spring portion in the direction perpendicular to the deformation direction of the second spring portion. The second spring portion may protrude, between the pair of frame portions, in the direction along the first spring portion. In this case, the second spring portion is located, in the direction perpendicular to the deformation direction of the second spring portion, between the frame portions. Thus, in mounting of the conductive member, turning-up of the second spring portion due to contact between a finger or the like of a worker and the second spring portion can be inhibited.

Moreover, the second spring portion may be configured to generate a repulsion force of at least 2 N. The inventor has found that, when the contact pressure of the conductive member becomes less than 2 N, in the case where the conductive member is exposed to an extremely severe temperature change inconceivable in typical use, corrosion tends to be rapidly accelerated. If the second spring portion can generate a repulsion force of at least 2 N, the contact pressure is set to equal to or higher than 2 N to favorably inhibit the corrosion.

Further, an electromagnetic shield structure of the present disclosure includes: the conductive member as described above; a printed circuit board having a mounting surface to which the first surface of the base portion of the conductive member is soldered; a sheet-metal disposed to face the mounting surface of the printed circuit board; and a cut portion formed at the sheet-metal. Part of the mounting surface to which the first surface is soldered and part of the sheet-metal formed with the cut portion face each other, and the cut portion is bent toward the printed circuit board to form a contact piece that is in contact with the first spring portion and the second spring portion of the conductive member.

In the electromagnetic shield structure configured as described above, the printed circuit board has the mounting surface to which the first surface of the base portion of the conductive member is soldered. In addition, the sheet-metal is disposed to face the mounting surface of the printed circuit board. Further, the cut portion is formed at the sheet-metal. The cut portion is bent toward the printed circuit board to form a contact piece. The contact piece is in contact with the first and second spring portions of the conductive member. The contact piece functions as the above-described wall. Moreover, the conductive member is disposed on the mounting surface at the position facing part of the sheet-metal formed with the cut portion. Thus, the contact state between the second spring portion and the contact piece can be visually checked from the outside (i.e., the side opposite to the printed circuit board) of the sheet-metal through the part formed with the cut portion.

Next, embodiments of the present disclosure will be described with reference to the drawings. Note that the embodiments of the present disclosure are not limited to the embodiments described below. Various embodiments can be implemented without departing from the gist of the embodiments of the present disclosure. As necessary, the description made below refers to each of the upper-lower, right-left, and front-back directions indicated in the drawings. Each of these directions is defined only for the sake of simply explaining the relative positional relationship among the components forming the conductive member. Thus, in actual use of the conductive member, the conductive member can be disposed in any orientation. For example, the conductive member may be used such that the upper-lower direction illustrated in the drawings is not coincident with the vertical direction in which the force of gravity acts.

Conductive Member Embodiment

Figures 1A, 1B, 1C, 1D, 1E, 1F:
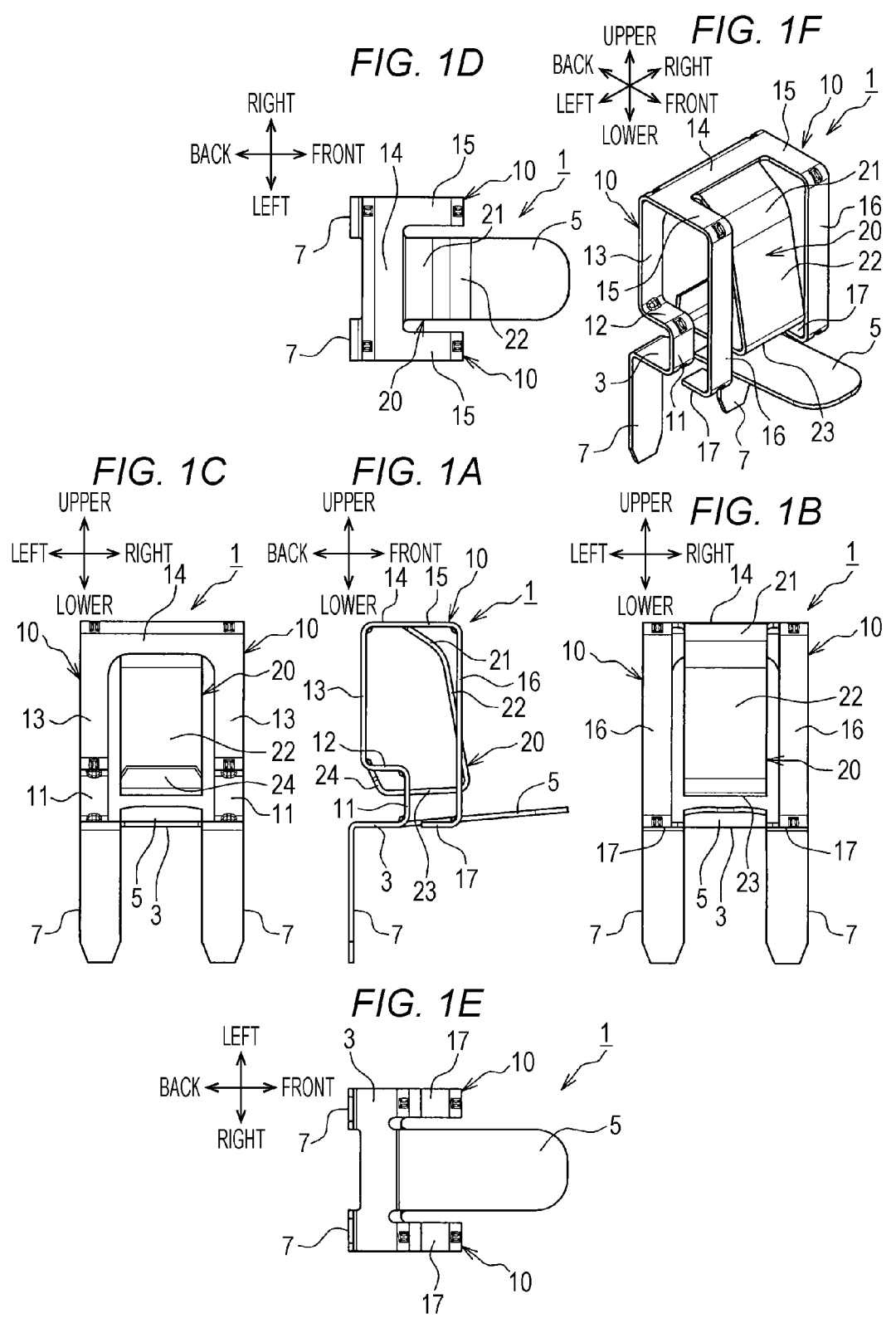

FIGS. 1A to 1F are views illustrating the configuration of a conductive member 1 of the present disclosure. The conductive member 1 is formed in such a manner that a single metal thin plate made of metal (e.g., phosphor bronze, beryllium copper, and SUS) having spring characteristics is punched and bent into a predetermined shape. "Bending" in the present disclosure does not necessarily mean sharp bending forming a crest. For example, the angle formed by bending may form a cylindrical shape (may have a so-called "Roundness").

As illustrated in FIGS. 1A to 1F, the conductive member 1 includes a rectangular plate-shaped base portion 3. A lower surface 3A (see FIG. 3) as a first surface of the base portion 3 forms a joint surface for soldering. A first spring portion 5 is connected to one (i.e., a front edge according to the directions defined in FIGS. 1A to 1F) of the long sides of the base portion 3. The first spring portion 5 is inclined in the direction away from the tangent plane of the lower surface 3A (i.e., toward the upper side defined in FIGS. 1A to 1F). When pressed toward the tangent plane, the first spring portion 5 generates repulsion force against such pressing force. Moreover, the first spring portion 5 is a tongue-shaped flat plate. Further, the angle between the first spring portion 5 and the base portion 3 is an obtuse angle.

A pair of leads 7 and 7 protruding in the direction (downward) penetrating the tangent plane is connected respectively to both ends of the other long side (a back edge) of the base portion 3 in the right-left direction. Moreover, the following pair of frame portions 10 and 10 is connected respectively to both sides of the front edge of the base portion 3 in the right-left direction.

Each frame portion 10 includes a first vertical portion 11 cut and raised upward to the right angle from the base portion 3, a first horizontal portion 12 connected, at the right angle, to extend backward from an upper end of the first vertical portion 11, and a second vertical portion 13 connected, at the right angle, to extend upward from a back end of the first horizontal portion 12. Note that the second vertical portion 13 of each frame portion 10 is disposed above the base portion 3. Moreover, the pair of second vertical portions 13 and 13 is, at upper ends thereof, connected in the right-left direction through a connection portion 14. The connection portion 14 is formed of a portion disposed on the same plane as that of the second vertical portions 13 and 13 and a portion bent at the right angle to extend forward from an upper end of the portion disposed on the same plane as that of the second vertical portions 13 and 13. The connection portion 14 has an L-shaped cross section.

Frame portions 10 and 10 respectively further include a pair of strip-shaped second horizontal portions 15 and 15 protruding forward from right and left ends of a front edge of the connection portion 14, third vertical portions 16 and 16 connected, at the right angle, to extend downward from front ends of the second horizontal portions 15 and 15, and fourth horizontal portions 17 and 17 connected, at the right angle, to extend backward from lower ends of the third vertical portions 16 and 16. The fourth horizontal portions 17 and 17 are arranged on the same plane as that of the base portion 3, the fourth horizontal portions 17 not overlapping with the base portion 3. Lower surfaces 17A and 17A (see FIG. 3) of the fourth horizontal portions 17 and 17 also form, together with the lower surface 3A, the joint surface for soldering.

The following second spring portion 20 is, between the second horizontal portions 15 and 15, connected to the front edge of the connection portion 14. The second spring portion 20 includes, in the order from the side close to the connection portion 14, a first inclined portion 21, a second inclined portion 22, a horizontal portion 23, and a third inclined portion 24.

The first inclined portion 21 is connected to the front edge of the connection portion 14, and is inclined in the lower front direction. The second inclined portion 22 is connected to a front edge of the first inclined portion 21. The second inclined portion 22 is also inclined in the lower front direction. Note that the downward inclination of the second inclined portion 22 is steeper than that of the first inclined portion 21. The horizontal portion 23 is connected to a lower end of the second inclined portion 22. The horizontal portion 23 extends, above the base portion 3 and the first spring portion 5, backward in parallel with the base portion 3. That is, the connection portion between the second inclined portion 22 and the horizontal portion 23 is disposed above the first spring portion 5 in the front of the third vertical portions 16 and 16. The third inclined portion 24 is formed of a back end portion of the horizontal portion 23 obliquely bent upward.

Even when the lower end of the second inclined portion 22 is pressed backward with a force of equal to or greater than 2 N, the second spring portion 20 has such strength that the lower end is not displaced backward beyond the third vertical portions 16 and 16 of the frame portions 10 and 10. When such pressing force is applied, the second spring portion 20 generates a repulsion force of equal to or greater than 2 N forward. In order that such repulsion force may not reach 2 N even when the entirety of the first spring portion 5 is deformed to reach the tangent plane, the first spring portion 5 forms the conductive member 1 of the present disclosure as a spring weaker than the second spring portion 20.

Electromagnetic Shield Structure Embodiment

Figure 2B:
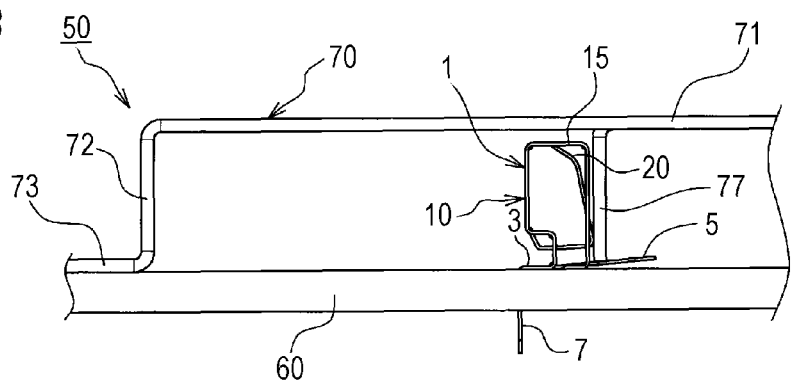
FIG. 2B is a side view illustrating the configuration of the main portion.
Figure 2C:
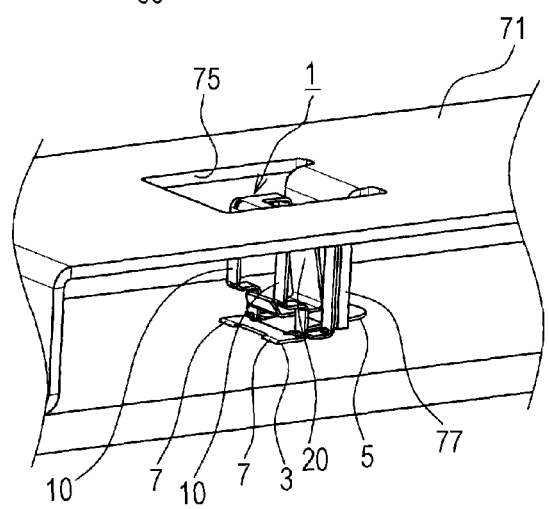
FIG. 2C is a perspective view illustrating the configuration of the main portion.

With the conductive member 1 configured as described above, an electromagnetic shield structure 50 as illustrated in FIGS. 2A to 2C can be configured, for example. As illustrated in FIGS. 2A to 2C, the electromagnetic shield structure 50 includes a printed circuit board 60 on which the conductive member 1 is mounted, and a shield case 70 disposed to cover a mounting surface.

The leads 7 and 7 of the conductive member 1 are inserted respectively into holes formed at the printed circuit board 60. Moreover, the lower surfaces 3A, 17A, and 17A of the conductive member 1 are soldered to a ground electrode on the mounting surface. In this manner, the conductive member 1 is mounted on the printed circuit board 60.

The shield case 70 includes a sheet-metal 71 disposed parallel to the mounting surface of the printed circuit board 60. An end portion of the sheet-metal 71 is bent at the right angle in the direction toward the printed circuit board 60 to form a side wall 72. Moreover, an end portion of the side wall 72 close to the printed circuit board 60 is bent outward along the printed circuit board 60. Such a bent portion forms a fixed portion 73 fixed to the printed circuit board 60. A cut portion 75 having a shape of three sides of a rectangle (a so-called U-shape) is formed at part of the sheet-metal 71 facing the conductive member 1. Part of the sheet-metal 71 inside the cut portion 75 is bent at the right angle in the direction toward the printed circuit board 60 to form a contact piece 77. The contact piece 77 is designed to contact the first spring portion 5 and the second spring portion 20 of the conductive member 1 mounted as described above. At this time, the contact piece 77 presses and deforms the second spring portion 20 backward (the direction toward the frame portions 10) with a force of equal to or greater than 2 N, and presses and deforms the first spring portion 5 in the direction toward the printed circuit board 60.

Advantageous Effects

Figure 3:
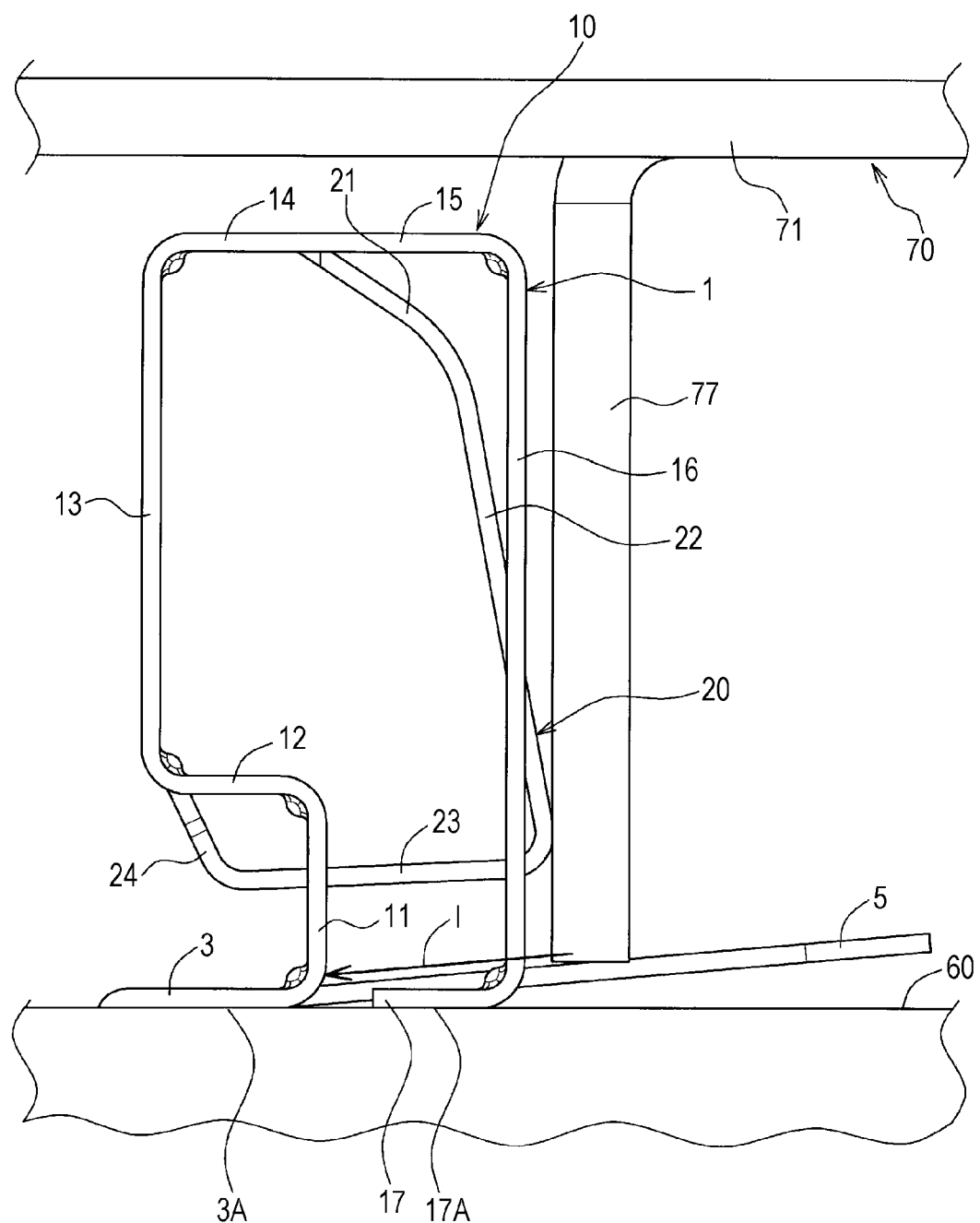
FIG. 3 is a side view illustrating the contact state between a sheet-metal and the conductive member in the electromagnetic shield structure.

The conductive member 1 configured as described above includes the first spring portion 5 and the second spring portion 20. As illustrated in FIG. 3, the contact piece 77 can pressure-contact the second spring portion 20 laterally (i.e., the direction along the mounting surface of the printed circuit board 60). Thus, even if such contact pressure is set high, the deflection of the printed circuit board 60 is inhibited. Moreover, since the contact piece 77 laterally pressure-contacts the second spring portion 20 as described above, the second spring portion 20 is less susceptible to vibration. Thus, the second spring portion 20 has such favorable durability that the second spring portion 20 can withstand ten million repetitions of compression.

The first spring portion 5 is directly connected to part of the base portion 3. When receiving, from the contact piece 77, force acting toward the printed circuit board 60, the first spring portion 5 generates repulsion force against such force, and pressure-contacts the contact piece 77. Thus, as indicated by an arrow I in FIG. 3, a current conduction path from the contact piece 77 to a soldering surface (the lower surface 3A) of the base portion 3 is shortened. Consequently, a lower impedance can be realized. Moreover, the angle between the first spring portion 5 and the base portion 3 is an obtuse angle. Thus, even when the first spring portion 5 repeatedly receives vibration, the damage of the connection portion between the first spring portion 5 and the base portion 3 is inhibited. Consequently, the first spring portion 5 has such favorable durability that the first spring portion 5 can withstand ten million repetitions of compression. Further, the repulsion force of the first spring portion 5 is set weaker than that of the second spring portion 20. Thus, the first spring portion 5 has more favorable durability.

In addition, the repulsion force applied to the contact piece 77 by the first spring portion 5 has such a component that the contact piece 77 pressure-contacts the second spring portion 20. Thus, the contact pressure between the contact piece 77 and the second spring portion 20 further increases. Further, the moment of force applied from the contact piece 77 to the entirety of the conductive member 1 through the first spring portion 5 points in the direction opposite to the moment of force applied from the contact piece 77 to the entirety of the conductive member 1 through the second spring portion 20. Thus, the deflection of the printed circuit board 60 is more favorably inhibited.

Moreover, the second spring portion 20 is located between the frame portions 10 provided on both the right and left sides of the second spring portion 20. Thus, in mounting of the conductive member 1, turning-up of the second spring portion 20 due to contact between a finger or the like of a worker and the second spring portion 20 can be reduced.

Further, the second spring portion 20 pressure-contacts the contact piece 77 with a repulsion force of equal to or greater than 2 N. Thus, lowering of electrical conductivity due to corrosion can be reduced. This point will be described below in detail.

Figure 4:
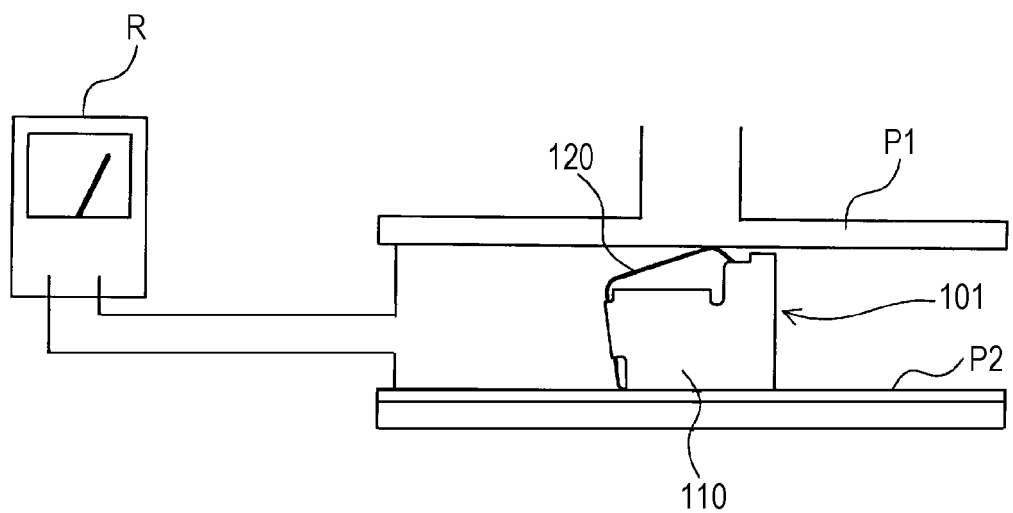
FIG. 4 is a schematic diagram illustrating a test apparatus configured to measure the relationship between a contact pressure and a resistance value.

The inventor conducted the following thermal shock test using various commercially-available conductive members 101. As illustrated in FIG. 4, the conductive member 101 is held between an electrode P1 and an electrode P2 in the experiment. The conductive member 101 includes a frame portion 110 and a spring portion 120. The frame portion 110 is soldered to the electrode P2, and the spring portion 120 connected to the frame portion 110 pressure-contacts the electrode P1 by elastic repulsion force. The resistance value between the electrodes P1 and P2 was measured by a milliohm meter R. Twenty samples were prepared for each of eleven products (sample Nos. 1 to 11) of the conductive member 101 showing a resistance value of 10 to 20 mΩ in this state. Note that the conductive member 101 including a frame portion 110 or a spring portion 120 having a shape different from that of the example illustrated in FIG. 4 is also included in the products.

In the thermal shock test, the operation of exposing, for one hour in total, the sample conductive member 101 and the electrodes P1 and P2 at −40° C. for 30 minutes and at 125° C. for 30 minutes was repeated ten million times. The relationship between the resistance value (the average of 20 resistance values) after the thermal shock test and the contact pressure (referred to as "Compression Force" in Table 1 and FIG. 5) of the spring portion 120 against the electrode P1 is shown in Table 1 and FIG. 5.

TABLE 1

| Sample No. | Compression Force (N) | avg (mΩ) |
|---|---|---|
| 1 | 0.583 | 560 |
| 2 | 0.803 | 592 |
| 3 | 0.895 | 272 |
| 4 | 0.980 | 360 |
| 5 | 1.849 | 296 |
| 6 | 2.211 | 63 |
| 7 | 4.555 | 58 |
| 8 | 4.846 | 61 |
| 9 | 4.883 | 8 |
| 10 | 7.070 | 32 |
| 11 | 7.195 | 10 |

Figure 5:
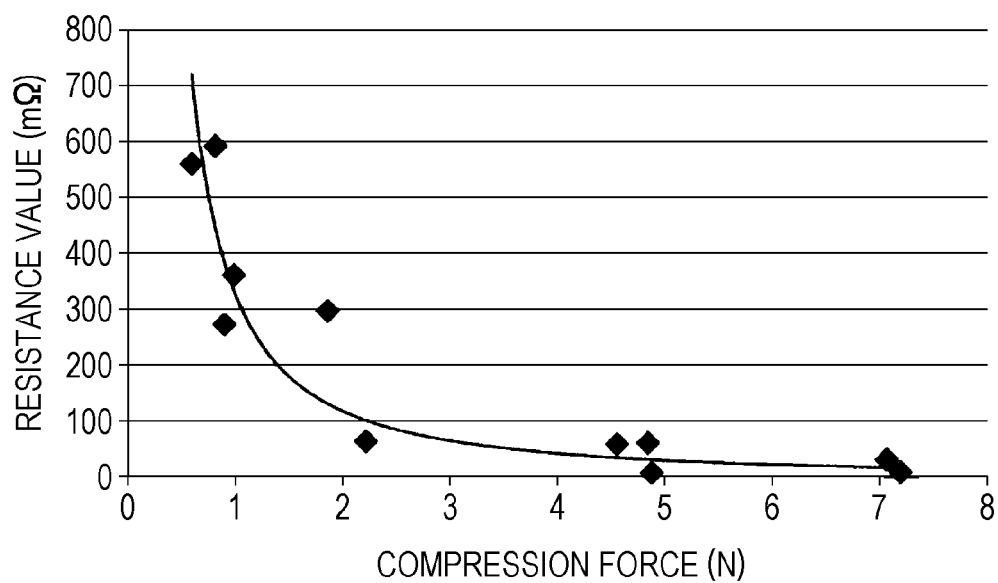
FIG. 5 is a graph showing the relationship between a contact pressure and a resistance value after a thermal shock test.

As shown in Table 1 and FIG. 5, the resistance values after the thermal shock test in almost all sample increase due to corrosion. Note that a smaller contact pressure results in a greater influence of corrosion. In particular, an approximate curve of FIG. 5 shows that when the contact pressure reaches less than 2 N, corrosion is rapidly accelerated by the thermal shock test. In the conductive member 1 of the present embodiment, the contact pressure of the second spring portion 20 is at least 2 N. Thus, it has been found that the conductive member 1 can favorably inhibit corrosion.

As described above, the conductive member 1 of the present embodiment has favorable vibration resistance and favorable heat corrosion resistance. Thus, the conductive member 1 of the present embodiment can be favorably used even for automobile electronic equipment and the like used under the environment with extremely strong vibration and a substantial change in a surrounding temperature. Moreover, since the current conduction path is shortened as described above in the conductive member 1, a lower impedance can be realized.

Moreover, in the electromagnetic shield structure 50, the lower surface 3A of the base portion 3 of the conductive member 1 is soldered to the mounting surface of the printed circuit board 60. The sheet-metal 71 is disposed to face the mounting surface of the printed circuit board 60. In addition, the cut portion 75 formed at the sheet-metal 71 is bent toward the printed circuit board 60. This forms the contact piece 77 that comes into pressure-contact with the first spring portion 5 and the second spring portion 20. Further, the conductive member 1 is disposed at the position facing the portion formed with the cut portion 75. Thus, the contact state between the second spring portion 20 and the contact piece 77 can be visually checked from the outside (i.e., the side opposite to the printed circuit board 60) of the sheet-metal 71 through the portion formed with the cut portion 75.

Other Embodiments

The embodiments of the present disclosure are not limited to the above-described embodiment. Various embodiments can be implemented without departing from the gist of the embodiments of the present disclosure. For example, in the above-described embodiment, the example where the conductive member 1 is configured as an on-board contact has been described. However, the conductive member 1 may be configured as an on-board clip or a side contact. Moreover, the leads 7 and 7 are not necessarily provided. Further, the shapes of the first spring portion 5, the frame portion 10, the second spring portion 20, etc. may be various shapes other than the above-described shapes. For example, the shape of the second spring portion 20 may be such a shape that the shape described in JP-A-2003-168510 lies on its side.

The conductive member of the embodiments of the present disclosure may be any of the following first to third conductive members.

The first conductive member is a conductive member configured such that a metal thin plate is bent. Such a conductive member includes: a base portion having a first surface serving as a joint surface for soldering; a first spring portion which is connected to part of the base portion to incline in the direction away from the tangent plane of the first surface and which generates repulsion force against force acting toward the tangent plane, the angle between the first surface and the first portion being an obtuse angle; and a second spring portion which is provided above a second surface of the base portion opposite to the first surface and which generates repulsion force parallel to the direction from the base portion toward the first spring portion.

The second conductive member is the first conductive member configured to further include a pair of frame portions which is provided on the second surface on both sides of the second spring portion in the direction perpendicular to the deformation direction of the second spring portion, the second spring portion protruding, between the pair of frame portions, in the direction along the first spring portion.

The third conductive member is the first or second conductive member configured such that the second spring portion is configured to generate a repulsion force of at least 2 N.

The electromagnetic shield structure of the embodiment of the present disclosure includes: the conductive member as described above; a printed circuit board having a mounting surface to which the first surface of the base portion of the conductive member is soldered; a sheet-metal disposed to face the mounting surface of the printed circuit board; and a contact piece which is formed in such a manner that a cut portion is formed at the sheet-metal and is bent toward the printed circuit board and which contacts the first and second spring portions of the conductive member. The conductive member is disposed at the position facing the portion formed with the cut portion.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A conductive member comprising:
a bent metal thin plate, wherein
the metal thin plate includes
a base portion having a first surface serving as a joint surface for soldering,
a first spring portion connected to part of the base portion, and
a second spring portion provided above a second surface of the base portion opposite to the first surface,
the first spring portion inclines in a direction away from a tangent plane of the first surface such that an angle between the first spring portion and the first surface is an obtuse angle, and generates repulsion force against force toward the tangent plane, and
the second spring portion generates repulsion force parallel to a direction from the base portion toward the first spring portion.

2. The conductive member according to claim 1, further comprising:
a pair of frame portions, wherein
the pair of frame portions is provided on the second surface on both sides of the second spring portion in a direction perpendicular to a deformation direction of the second spring portion, and
the second spring portion protrudes, between the pair of frame portions, in a direction along the first spring portion.

3. The conductive member according to claim 2, wherein the second spring portion is configured to generate a repulsion force of at least 2 N.

4. An electromagnetic shield structure comprising:
the conductive member according to claim 2;
a printed circuit board having a mounting surface to which the first surface of the base portion of the conductive member is soldered;
a sheet-metal disposed to face the mounting surface of the printed circuit board; and
a cut portion formed at the sheet-metal, wherein
part of the mounting surface to which the first surface is soldered and part of the sheet-metal formed with the cut portion face each other, and
the cut portion is bent toward the printed circuit board to form a contact piece that is in contact with the first spring portion and the second spring portion of the conductive member.

5. An electromagnetic shield structure comprising:
the conductive member according to claim 1;
a printed circuit board having a mounting surface to which the first surface of the base portion of the conductive member is soldered;
a sheet-metal disposed to face the mounting surface of the printed circuit board; and
a cut portion formed at the sheet-metal, wherein
part of the mounting surface to which the first surface is soldered and part of the sheet-metal formed with the cut portion face each other, and
the cut portion is bent toward the printed circuit board to form a contact piece that is in contact with the first spring portion and the second spring portion of the conductive member.

6. The conductive member according to claim 1, wherein the second spring portion is configured to generate a repulsion force of at least 2 N.

7. An electromagnetic shield structure comprising:
the conductive member according to claim 6;
a printed circuit board having a mounting surface to which the first surface of the base portion of the conductive member is soldered;
a sheet-metal disposed to face the mounting surface of the printed circuit board; and
a cut portion formed at the sheet-metal, wherein
part of the mounting surface to which the first surface is soldered and part of the sheet-metal formed with the cut portion face each other, and
the cut portion is bent toward the printed circuit board to form a contact piece that is in contact with the first spring portion and the second spring portion of the conductive member.

* * * * *